United States Patent
Beyfuss et al.

(10) Patent No.: US 10,701,810 B2
(45) Date of Patent: Jun. 30, 2020

(54) METHOD FOR MANUFACTURING A CIRCUIT

(71) Applicant: Sivantos Pte. Ltd., Singapore (SG)

(72) Inventors: Stefanie Beyfuss, Erlangen (DE); Holger Kral, Fuerth (DE); Bjoern Freels, Erlangen (DE); Johannes Kuhn, Nuremberg (DE)

(73) Assignee: Sivantos Pte. Ltd., Singapore (SG)

( * ) Notice: Subject to any disclaimer, the term of this patent is extended or adjusted under 35 U.S.C. 154(b) by 295 days.

(21) Appl. No.: 15/714,188

(22) Filed: Sep. 25, 2017

(65) Prior Publication Data

US 2018/0020555 A1 Jan. 18, 2018

Related U.S. Application Data

(63) Continuation of application No. PCT/EP2016/056146, filed on Mar. 21, 2016.

(30) Foreign Application Priority Data

Mar. 25, 2015 (DE) .......................... 10 2015 205 431

(51) Int. Cl.
*H05K 3/34* (2006.01)
*H04R 25/00* (2006.01)
(Continued)

(52) U.S. Cl.
CPC .............. *H05K 3/341* (2013.01); *H04R 25/00* (2013.01); *H04R 25/60* (2013.01); *H05K 3/0076* (2013.01);
(Continued)

(58) Field of Classification Search
CPC ................... H04R 25/00; H04R 25/60; H05K 2201/10204; H05K 2201/1028;
(Continued)

(56) References Cited

U.S. PATENT DOCUMENTS 3,138,850 A * 6/1964 Loro ...................... H04R 21/04
427/124
4,255,469 A 3/1981 McGinness
(Continued)

FOREIGN PATENT DOCUMENTS

| CN | 1316872 A | 10/2001 |
|---|---|---|
| JP | 2008205169 A | 9/2008 |
| KR | 2011 011 3482 A | 10/2011 |

OTHER PUBLICATIONS

International Preliminary Report (IPER) dated Mar. 21, 2016 (English Version).

*Primary Examiner* — Minh N Trinh
(74) *Attorney, Agent, or Firm* — Muncy, Geissler, Olds & Lowe, P.C.

(57) ABSTRACT

A method for manufacturing a circuit, in particular of a hearing aid, in which method a printed circuit board is made available with a first region and with a second region which are separated by means of a boundary. A component is mounted on the printed circuit board, wherein the component is positioned on the boundary. The first region is covered by means of a mask which has an edge, wherein the edge is positioned on the component, and the printed circuit board is provided with a coating. The coating is cut away in the region of the component and the mask is removed.

11 Claims, 2 Drawing Sheets

(51) Int. Cl.
*H05K 3/28* (2006.01)
*H05K 3/00* (2006.01)

(52) U.S. Cl.
CPC ..... *H05K 3/284* (2013.01); *H05K 2201/0989* (2013.01); *H05K 2201/09781* (2013.01); *H05K 2201/1028* (2013.01); *H05K 2201/10204* (2013.01); *H05K 2203/0228* (2013.01); *H05K 2203/0557* (2013.01); *H05K 2203/107* (2013.01)

(58) Field of Classification Search
CPC . H05K 2203/0228; H05K 2201/09781; H05K 2201/0989
See application file for complete search history.

(56) References Cited

U.S. PATENT DOCUMENTS

| | | |
|---|---|---|
| 6,060,683 A | 5/2000 | Estrada |
| 7,882,625 B2 | 2/2011 | Aoya |
| 9,374,891 B2 * | 6/2016 | Bartulec ............... H05K 1/0284 |
| 9,403,236 B2 * | 8/2016 | Astle .................... C23C 14/042 |
| 2018/0020555 A1 * | 1/2018 | Beyfuss ................ H05K 3/284 |

\* cited by examiner

METHOD FOR MANUFACTURING A CIRCUIT

This nonprovisional application is a continuation of International Application No. PCT/EP2016/056146, which was filed on Mar. 21, 2016, and which claims priority to German Patent Application No. 10 2015 205 431.4, which was filed in Germany on Mar. 25, 2015, and which are both herein incorporated by reference.

BACKGROUND OF THE INVENTION

Field of the Invention

The invention relates to a process for manufacturing a circuit. The circuit comprises a printed circuit board and is, for example, an electric or electronic circuit. For example, the circuit can be a component of a hearing aid.

Description of the Background Art

Circuits typically have electrical and/or electronic components. By means of these, certain functions are fulfilled, for which it is necessary that the individual components electrically contact each other. To achieve a comparatively small size of the circuit, a relatively high degree of robustness and a comparatively short production time, a printed circuit board is habitually used to manufacture such circuits.

The printed circuit board is made, for example, of a glass-fiber-reinforced epoxy resin, on which the conductor tracks are positioned in a fixed, predetermined layout. The conductor tracks, depending on their complexity and on the circuit requirements, are located on the surface or are embedded in the epoxy resin so that a multilayer printed circuit board is provided. With the individual conductor tracks, the electrical or electronic components are electrically contacted so that the prescribed functionality of the circuit is realized. Mounting is usually performed in one working step with the electrical contacting, for which the components are soldered to the conductor tracks.

If the circuit is exposed to a corrosive atmosphere, it is necessary to protect the individual components after they have been mounted on the conductor tracks, as well as the terminal areas and the conductor tracks themselves. If the circuit is part of a hearing aid, the circuit must therefore be resistant to both human sweat and earwax since these could cause either damage or a short circuit of the individual components. It is also necessary that the circuit be designed to be comparatively small, so that it can be inserted into the ear canal of a person or fits in the ear.

Usually, a coating is used to protect the conductor tracks and the components mounted on the printed circuit board. In this case, certain areas are provided with a liquid coating by means of a dispensing process. Areas with which the circuit is electrically contacted after manufacturing, such as potential battery terminals, are either covered with a mask beforehand or remain free of the latter due to the performance of the dispensing process and the viscosity of the liquid coating adjusted for the process. If the mask is used, the circuit is provided with the coating, with the exception of the regions covered by the mask. After the coating is cured, the mask is removed from the printed circuit board. For this purpose, the coating must first be cut away circumferentially around the mask, which is usually accomplished by means of a laser or comparatively sharp-edged and precisely manufactured tools. In particular with relatively delicate printed circuit boards, as is the case with hearing aids, damage to the printed circuit board due to too strong a pressure from the sharp-edged tool or from an incorrectly set laser cannot be ruled out, which would lead to an impaired operation of the circuit.

If the mask is removed without prior cutting away of the coating, the coating may separate not only in the region of the mask but also in other areas of the circuit, removing the insulation at those locations where it is desired. As a result, the circuit is only partially coated and thus also exposed to damage from a corrosive atmosphere. Consequently, during manufacturing, waste is increased. In addition, relatively expensive tools are needed.

SUMMARY OF THE INVENTION

It is therefore an object of the invention to provide a particularly suitable method for manufacturing a circuit, in which in particular the costs for the manufacture of the circuit are reduced and preferably simultaneously, the error rate is also reduced.

In an exemplary embodiment, the method is intended for the manufacture of a circuit, for example, an electrical or electronic circuit. The term circuit can be understood to be a combination of electrical and/or electronic components that form a working arrangement. The circuit can be a component of a listening aid device, such as a hearing aid. Hearing aids are portable hearing devices used to assist the hearing impaired. These are, for example, Behind The Ear hearing aids, In The Ear hearing aids, or In Canal hearing aids (concha hearing aids). In other words, the method is used in particular to manufacture a circuit which can be used for manufacturing such a hearing aid.

In a working step, a printed circuit board with a first and a second region is provided. The first region is separated from the second region by a boundary. For example, the first and second region directly border each other, and precisely the terminal areas of the two regions are the boundary. Preferably, the boundary is designed as a straight line, at least in sections. The layout of the printed circuit board is such that in the mounting state those construction parts and/or conductor tracks of the circuit that are provided with a coating are positioned within the second region, i.e., those components or conductor tracks, which are particularly exposed to a corrosive atmosphere during the intended use of the circuit. To this end, located in the first region are the sections of the conductor tracks, the conductor tracks and/or the circuit components which are not to be provided with a coating, so for example, connections for cables or other components, or for example, other components of the hearing aid, provided that the circuit is a part thereof.

In a further step, a component is mounted on the printed circuit board. The component is positioned on the boundary. In other words, the component is mounted on the printed circuit board, on the boundary. Consequently, the boundary is covered by means of the component. In particular, a section of the component is located in the first and in the second region. The component is secured to the printed circuit board so that this is held in place on the printed circuit board. In again other words, the component overlaps the boundary so that both a section of the first region of the printed circuit board facing the boundary, and a section of the second region of the printed circuit board facing the boundary, are covered by means of the component. In this case, the component is preferably in direct mechanical contact with the printed circuit board. In particular, in the region of the boundary, the printed circuit board is covered in an airtight and/or liquid-tight manner by means of the component.

In a further step, the first region is covered by a mask. In other words, the mask is applied to the first region in an airtight and/or liquid-tight manner so that due to the mask, no gas or liquid exchange can take place between the first region and the surrounding area of the printed circuit board. The mask has an edge, which is positioned on the component. In particular, the shape of the edge corresponds to the shape of the boundary, and the edge is located on the side of the component positioned opposite the boundary. Appropriately, by means of the edge, the mask rests in a form-fitting manner on the component, i.e., is flush. In particular, the edge is coincident with the boundary.

In a further step, the printed circuit board is provided with a coating. In this case, the coating is applied to the printed circuit board from the surrounding area of the printed circuit board so that the second region of the printed circuit board is provided with the coating. Since the first region is covered by the mask, the mask is provided with the coating, whereas the first region remains free of the coating. When coating, an electrically insulating coating is advantageously used. Preferably in a further step, the coating is cured, unless it is already in a solid state when applied. In this way, unintentional separation of the coating from the second region of the printed circuit board is substantially prevented.

In a further step, the coating is cut away in the region of the component. In particular, the line of separation runs on the side of the component located opposite the printed circuit board. For example, the line of separation is coincident with the boundary between the first and second regions. The printed circuit board is hereby protected from possible damage by means of the component. In particular, at deeper penetration of a tool being used for this purpose, the component is initially damaged. Upon exertion of pressure, the component also provides stability for the printed circuit board so that the latter does not break.

In a further step, the mask is removed. Since the coating was cut away in the region of the component, no forces are exerted on the coating applied in the second region of the printed circuit board during removal of the mask. Therefore, the coating in the second region remains. Suitably, the component is retained on the printed circuit board and the circuit is installed in the desired area of application, for example, in the hearing aid. The method ensures that the second region of the circuit is always provided with the coating, wherein due to the component, damage to the printed circuit board is precluded. Consequently, on the one hand, comparatively inexpensive tools for the separation of the coating can be used, and on the other hand, an adverse effect on the operation of the printed circuit board is prevented.

For example, the printed circuit board has a plurality of circuits, which are, for example, of similar design. After removal of the mask, the individual circuits are suitably separated from the printed circuit board, for example, broken out or cut out. In other words, the printed circuit board is cut open, and each circuit comprises a section of the printed circuit board, wherein the circuits are separated from each other. In this way, a plurality of circuits can be manufactured by carrying out the method.

The printed circuit board can be sprayed with the coating. For example, the coating is available in liquid form. In this case, the coating is preferably first atomized, i.e., converted into a droplet form, with which the board is coated. Particularly preferred, however, a gaseous coating is chosen. In other words, the material of the coating is brought into a gaseous state prior to coating the printed circuit board, and the printed circuit board is vapor-deposited by means of the gas produced in this way. Thus, the coating performance is improved and the formation of bubbles in the coating is prevented. In addition, relatively inaccessible areas of the printed circuit board, such as cavities or corners, are provided with the coating. In particular, the gaseous coating condenses on the printed circuit board and in this way forms a protective film.

For example, as a coating, a polymeric dispersion is used, for example latex. Particularly preferred, a parylene is used as a coating. Such a coating stays relatively stable on a wide variety of materials, wherein electrical insulation is ensured.

The coating can be cut away by means of a laser, resulting in a comparatively precise separation. Particularly preferably, however, the coating is cut away by means of a blade. In other words, the coating is cut in the region of the component. Suitably, a knife is used for this purpose. This way, on the one hand, a comparatively low-cost separation, and on the other hand, a relatively quick separation of the coating is provided, wherein protection devices for persons can be relatively simple and inexpensive.

Advantageously, the coating is cut away along the edge of the mask. Consequently, the cutting line is defined by the edge. In this way, it is possible to guide the cutting tool using the edge or other components of the mask. In particular, if a knife is used as the tool, slippage of the knife is prevented in this manner, which could lead to damage of other components of the circuit. Alternatively or in combination therewith, a serrated edge is chosen. In this way, separation of the mask from the component after cutting away the coating is simplified. Moreover, in case the coating is cut away along the edge, due to the serrated rim, force application on the tool is reduced, which bears against the mask only in the region of the teeth. In other words, the coating is only cut away along the edge in the region of the teeth, wherein suitably a straight line is defined by means of these regions, along which the coating is cut away. In addition, because of the serrated edge, possible damage to the mask is reduced, so that it can be reused for a relatively large number of circuit manufacturing processes.

For example, a mask is used, which was created from a rubber or a silicone. In this way, the mask is relatively flexible and elastic and/or plastically deformable, so that attachment and subsequent removal are facilitated. In addition, this way, any possible irregularity is compensated, which is why the first region is reliably covered. Alternatively, the mask is made of a metal. Consequently, the mask is comparatively stable. Particularly preferred, at least the edge of the mask is made of a metal. Suitably, the edge is pressed against the component after coating so that as a result, the coating is cut away in the region of the edge. In other words, the edge acts as a blade for separating the coating. If the edge is serrated, the coating is perforated as a result. For example, the component is at least partially plastically deformed in the region of the edge. In particular, therefore, an impression of the edge is created inside the component, wherein the penetration depth is preferably less than 1 mm, 0.5 mm or 0.1 mm. In this way, damage to the board is prevented.

For example, the first region is an edge region of the printed circuit board. In other words, the edge region of the printed circuit board is not provided with the coating. In this way, electrical contacting of the circuit is facilitated after manufacturing. For example, the mask has a gap into which the printed circuit board is inserted. In other words, the first region is covered by the mask due to the printed circuit board being inserted into the gap. Preferably, the first region is an edge region of the printed circuit board and the mask has the gap. Consequently, the edge region, which is inserted into the gap, is covered by the mask. In particular, the depth of the gap is equal to the expansion of the first region. Particularly preferably, the boundary is a straight line which suitably lies parallel to an edge of the printed circuit board.

In an embodiment, the component can be mounted on the printed circuit board by means of SMD technology. In this way, the manufacturing time is shortened. For example, the component is an SMD component or comprises a plurality of such SMD components, which are each suitably in direct contact with one another, so that the full extent of the boundary is covered by the SMD parts of the component.

In an embodiment, a further electronic or electrical component can be mounted on the printed circuit board using SMD technology. Suitably, a plurality of electronic and/or electrical components are mounted on the printed circuit board using SMD technology. In particular, the mounting of these components is completed in the same working step, such as in the step in which the component is mounted on the printed circuit board. The electronic and electrical component is suitably electrically contacted by means of a conductor track of the printed circuit board. During operation of the circuit, a function is perceived by means of the electrical or electronic component.

For example, the component that is positioned on the boundary is made of a metal or a ceramic. In this way, the component is relatively resistant to damage when the coating is cut away. For example, the component is designed in the form of strips, particularly a metal strip. In an alternative, the component is realized by means of a further printed circuit board, which in particular is designed in the form of strips.

In an embodiment, the component can be contacted electrically only with the printed circuit board. In particular, the component performs no function during operation of the circuit. In other words, the component is not crucial for the operation of the circuit. For example, the component is a so-called dummy, in particular a dummy SMD component.

In an embodiment, the component is not electrically contacted with any conductor track. If the component is fixed to the printed circuit board by means of SMD technology, the former is preferably only electrically contacted with electrically isolated contacting or soldering surfaces ("pad"), which are not electrically contacted with any further conductor track. In this way, the circuit is prevented from being influenced by the component. If the component should later be damaged during separation of the coating, the operation of the circuit is not impaired.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
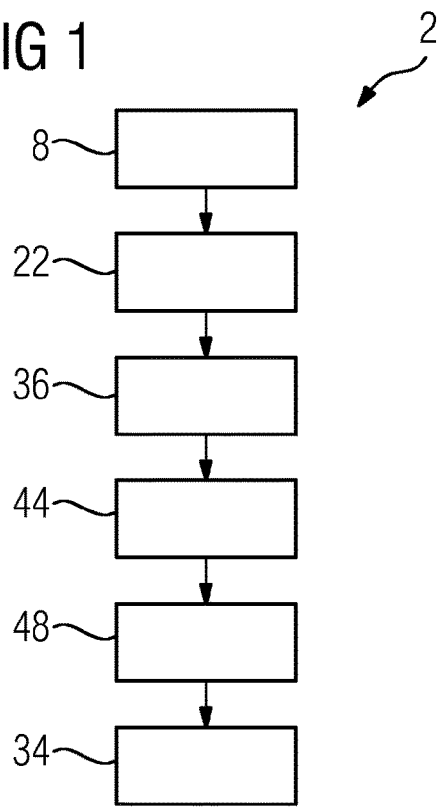
FIG. 1 illustrates schematically, a method for manufacturing a circuit.
Figure 2:
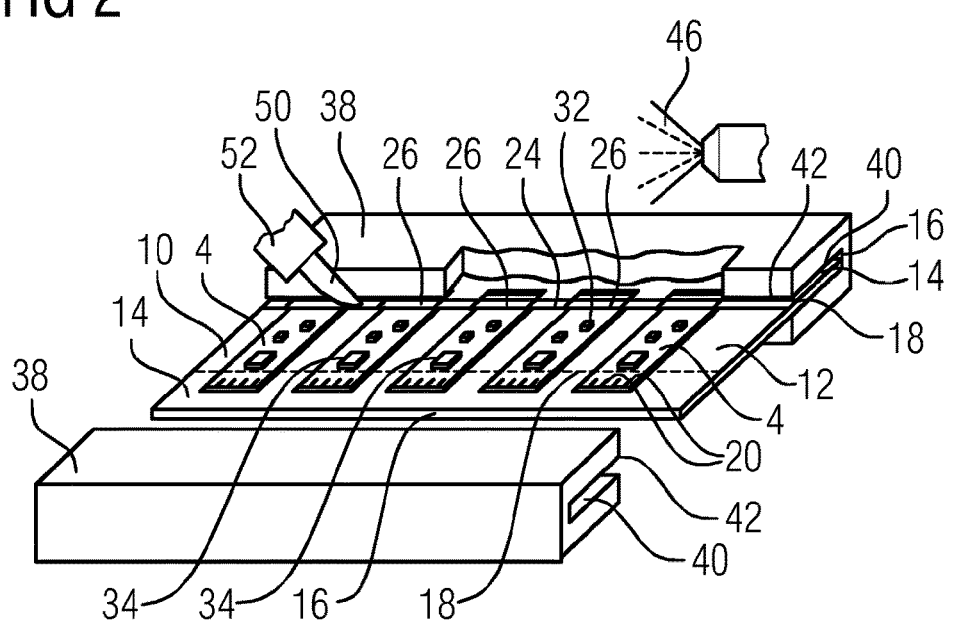
FIG. 2 is a perspective of various working steps for processing a printed circuit board.
Figure 5:
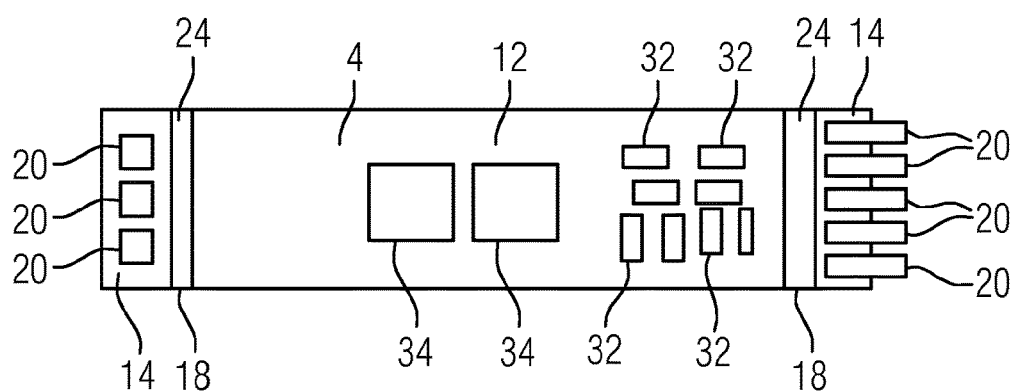
FIG. 5 is a plan view of the circuit.
Figure 6:
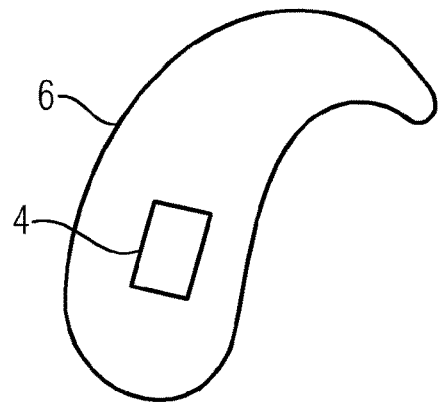
FIG. 6 is a schematically simplified hearing aid.

In FIG. 1, a method 2 for manufacturing an electronic circuit 4 illustrated in FIG. 5 is shown, which circuit is part of a hearing aid 6 shown in FIG. 6. In a first working step 8, a printed circuit board 10 shown in FIG. 2 is provided. By means of the printed circuit board 10, for example, the same circuit 4 is to be created five times. The printed circuit board 10 has a second region 12, which is exposed to human sweat in a human ear during assembly of the hearing aid 6. The printed circuit board 10 also has two first regions 14, which form two opposite lying edge regions 16 of the printed circuit board 10. The second region 12 is hereby positioned between the two rectangular first regions 14 and separated therefrom in each case by means of a boundary 18. The boundaries 18 are in each case straight and parallel to each other. Furthermore, the second region 12 and in each case one of the first regions 14 are in contact with each other along the respective boundary 18. Within the first regions 14 are terminal areas 20, by means of which further components of the hearing aid 6 are electrically contacted with the circuit during assembly of the hearing aid 6.

Figure 4:
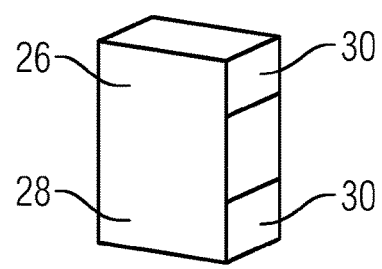
FIG. 4 shows, in perspective, a component.

In a second step 22, in each case a component 24 is positioned on the boundaries 18 and soldered to the printed circuit board 10 by means of SMD technology. The component 24 is, for example, a metal strip whose length is at least equal to the length of the respective boundary 18. In an alternative thereto, the component 24 has a number of dummy SMD components 26, one of which is shown in FIG. 4. The cuboid dummy SMD component 26 has a cuboid body 28, to one side of which two pads 30 made of metal are secured. Accordingly, none of the dummy SMD components 26 provide a function. The dummy SMD components 26 are connected to corresponding pads of the printed circuit board 10 in the second step 22. The dummy SMD components 26 are positioned directly adjacent to each other so that no space remains between adjacent dummy SMD components 26 and any possible slots are closed by means of the solder used. The components 24 as well as the parts thereof, the dummy SMD components 26, are only in electrical contact with the printed circuit board 10, i.e., not with the terminal areas 20 or any possible conductor tracks. In other words, the components 24 are only connected to pads of the printed circuit board 10, wherein the pads are electrically insulated from further conductor tracks of the printed circuit board 10.

Also in the second step 22, electrical components 32 and electronic components 34 are in electrical contact with the printed circuit board 10 and its conductor tracks by means of SMD technology. In this manner, a connection is established between the individual terminal areas 20 as well as the electrical and electronic components 32, 34, and the circuit 4 is operable. Also, the electrical and electronic components 34 are not in electrical contact with the components 24, but electrically insulated therefrom.

In a third step 36, each of the first regions 14 is covered by an associated mask 38, of which one is illustrated opened up in FIG. 2. Each cuboid mask 38 is made of a rubber, a silicone or a metal, and includes a gap 40 into which the printed circuit board 10 is inserted. The depth of the gap 40 is equal to the expansion of the first region 14, so that in the first region 14, the printed circuit board 10 is surrounded in a form-fitting manner by the mask 38. By means of the gap 40, an edge is formed 42 that is positioned congruent to the boundary 18. In other words, the configuration of the edge 42 corresponds to the configuration of the respective boundary 18, wherein, however, the component 24 associated with the respective boundary 18 is arranged between the mask 38 and the boundary 18. As a result, the edge 42 is positioned on the component 24 and overlaps it accordingly.

In a fourth step 44, the printed circuit board 10 is provided with a gaseous coating 46. As a coating 46, parylene is used. Due to the masks 38, only the second region 12 as well as parts of the components 24 and the masks 38 are vapor-deposited with the coating 46, wherein due to the gaseous phase, on the one hand, the formation of bubbles during attachment to the printed circuit board 10 and the electrical and electronic components 32, 34 is avoided. Furthermore, all corners, edges and any cavities formed are provided with the coating 46.

In a fifth step 48, the coating 46 that is cured on the printed circuit board 20 and the components 24 as well as the masks 38 are cut away by means of a blade 50. For this purpose, a knife 52 exhibiting a blade 50 is moved along the edge 42 over the component 24, thus separating the coating 46 along the respective edge 42 of the mask 38. In this case, the blade 50 partially cuts into the respective component 24, which, however, does not impair the operation of the circuit 4. In an alternative not shown, the coating 46 is cut away along the edge 42 by means of a laser.

In a sixth step 54, the masks 38 are removed and the first regions 14 are freed. Further, the five circuits 4 shown in FIG. 2 are cut out or broken out of the printed circuit board 10 so that the circuit 4 shown in FIG. 5 is created.

Figure 3:
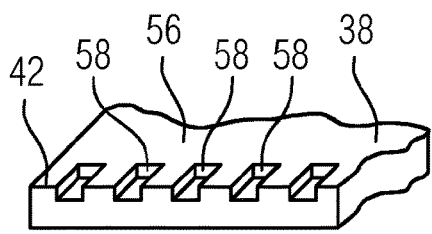
FIG. 3 shows a section of a serrated edge of a mask.

In FIG. 3, a section of an alternative embodiment of the mask 38 is shown. The mask 38 is designed plate-shaped, wherein the size of the mask 38 is greater than the respective first region 14. The surface 56 facing the printed circuit board 10 has recesses 58 at one of its edge regions resulting in the edge 42 to be positioned on the component 24 being serrated. Following execution of the fourth working step 44, when using this mask 38, the edge 42 is pressed against the respective component 24 in the fifth step 48 and hence, the coating 46 is perforated in this way, i.e., cut away. When removing the mask 38 from the printed circuit board 10, thus, the coating 46 separates along the perforation, so that the coating 46, which is located in the second region 12, is not damaged.

The invention is not limited to the exemplary embodiments described above. Rather, the skilled expert can derive other variants of the invention therefrom without departing from the scope of the invention. In particular, furthermore, all individual features described in connection with the respective embodiments can be combined in other ways with one another without departing from the scope of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for manufacturing a circuit, the method comprising:
    providing a printed circuit board having first components, conductor tracks and terminal areas mounted thereon to operate as the circuit, the printed circuit board having a first region and a second region that are separated by a boundary line, wherein at least the terminal areas are provided in the first region and at least the first components are provided in the second region;
    mounting a second component on the printed circuit board, the second component being positioned directly on top of and extending along the boundary line, such that the second component is aligned with the boundary line;
    covering the first region via a mask, wherein during covering the first region, an edge of the mask is positioned on the second component, such that the edge of the mask is aligned with the second component;
    providing the printed circuit board with a coating;
    cutting the coating at the second component, such that the coating is cut along the second component in alignment with the boundary line and the edge of the mask;
    removing the mask; and
    after removing the mask, removing a portion of the printed circuit board from a remainder of the printed circuit board, the portion of the printed circuit board including the first components, the conductor tracks and the terminal areas, such that the portion of the printed circuit board removed from the remainder of the printed circuit board forms the circuit.

2. The method according to claim 1, wherein the coating provided on the printed circuit board is a gaseous coating or a parylene coating.

3. The method according to claim 1, wherein the cutting of the coating is performed via a blade.

4. The method according to claim 3, wherein the blade is guided along the edge of the mask over the second component during the cutting, such that the coating is cut along the edge of the mask, and wherein the edge of the mask is serrated.

5. The method according to claim 1, wherein the mask is formed of a rubber, a silicone, or a metal.

6. The method according to claim 1, wherein the first region is an edge region of the printed circuit board and wherein the edge region of the printed circuit board is inserted into a gap in the mask.

7. The method according to claim 1, wherein the second component is made of a metal or a ceramic.

8. The method according to claim 1, wherein the second component is electrically contacted only with the printed circuit board.

9. The method according to claim 1, further comprising inserting the circuit into a hearing aid.

10. The method according to claim 1, wherein at least the edge of the mask is made of metal, and wherein the cutting of the coating along the second component in alignment with the edge of the mask is provided by pressing the edge of the mask against the second component, such that the edge of the mask acts as a blade to cut the coating.

11. The method according to claim 10, wherein the edge of the mask is serrated, such that during pressing of the edge of the mask against the second component, the coating is perforated and the second component is at least partially deformed.

* * * * *